United States Patent [19]

Takeuchi

[11] 4,037,151
[45] July 19, 1977

[54] APPARATUS FOR MEASURING THE PERIOD AND FREQUENCY OF A SIGNAL

[75] Inventor: Yasuhito Takeuchi, Kunitachi, Japan

[73] Assignee: Hewlett-Packard Company, Palo Alto, Calif.

[21] Appl. No.: 662,058

[22] Filed: Feb. 27, 1976

[51] Int. Cl.² ............................................. G01R 23/02
[52] U.S. Cl. ................................. 324/78 R; 324/77 G; 235/181
[58] Field of Search .................... 324/77 G, 78 R, 79, 324/77 R; 343/100 CL; 235/181; 340/174 SB; 128/2.06 F, 2.06 A, 2.06 R

[56] References Cited
U.S. PATENT DOCUMENTS

| 3,388,398 | 6/1968 | Kratzer et al. | 324/77 G |
| 3,714,621 | 1/1973 | Waters | 324/77 G |
| 3,750,152 | 7/1973 | Waful | 235/181 |
| 3,816,722 | 6/1974 | Sakoe et al. | 235/181 |
| 3,819,920 | 6/1974 | Goldfischer | 235/181 |

Primary Examiner—Rudolph V. Rolinec
Assistant Examiner—Michael J. Tokar
Attorney, Agent, or Firm—Stephen P. Fox; Robert S. Hulse

[57] ABSTRACT

The present invention relates to an apparatus for measuring, by cross-correlation, the period and frequency of a substantially periodic signal having random components, such as fetal heart beat signals and other biological signals.

12 Claims, 10 Drawing Figures

APPARATUS FOR MEASURING THE PERIOD AND FREQUENCY OF A SIGNAL

BACKGROUND OF THE INVENTION

Generally, biological signals with random components or signals embedded in noise such as heart valve signals embedded in extraneous blood flow and muscle signals, or fetal heart beat signals whose shape and amplitude change as the fetus moves in the mother, present special difficulties in measuring. To accomplish such signal measuremet, the signal being measured is often cross-correlated with a known signal similar in shape to the signal being measured.

Utilization of known cross-correlation methods, however, require substantially exact knowledge of the periodic components of the signal to be measured in order to provide a suitable reference signal, and such exact knowledge is difficult to obtain because the frequency, amplitude and shape of such signals often vary over time.

SUMMARY OF THE INVENTION

According to the illustrated preferred embodiment of the present invention, an apparatus is provided for measuring by cross-correlation the period and frequency of a substantially periodic signal having random components, without the need for substantially exact knowledge of the periodic components inherent in such signal. The apparatus includes a first and second memory means for storing portions of the signal to be measured and portions of a referene signal, a cross-correlator means for cross-correlating portions of the signal to be measured with portions of the reference signal, to produce a cross-correlated signal, a peak detecting means for detecting the occurrences of peaks in the cross-correlated signal, processing means for deriving the period between peaks and the frequency of said peaks, and updating means for updating the reference signal in said second memory to produce a reference signal approximating the periodic signal.

DESCRIPTION OF THE PREFERRED EMBODIMENT

Figure 1:
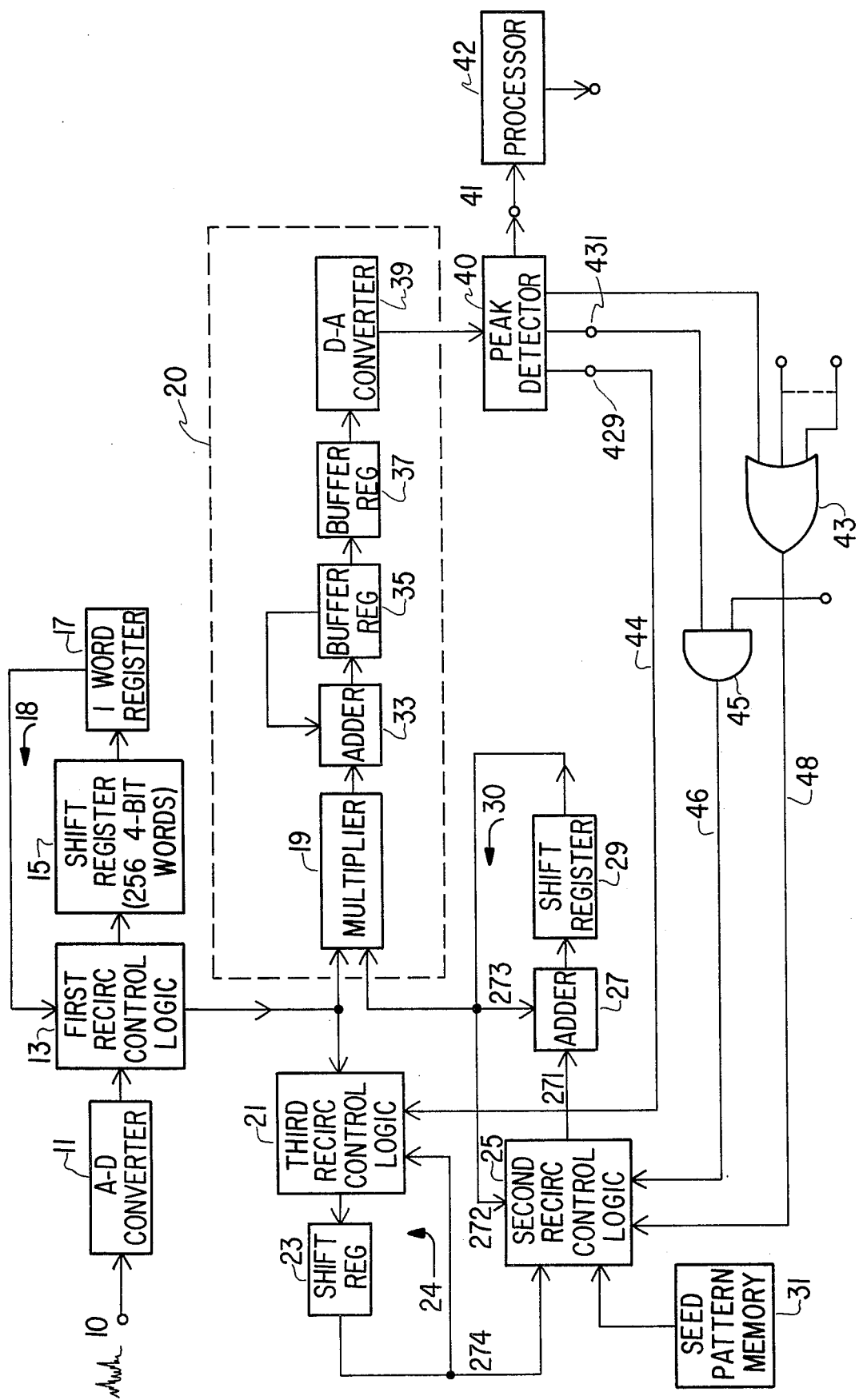
FIG. 1 is a block diagram of a preferred embodiment of the apparatus of the present invention.

FIG. 1 shows an analog signal applied to terminal 10 of a first converter means identified as analog to digital (A-D) converter 11. A-D converter 11 samples the analog signal at a 400 Hz sample rate and converts the analog signal to digital samples in 4-bit 2's compliment fixed-point binary form.

The binary values from converter 11 are fed into a shift register 15 of a first recirculation control memory. loop 18 via a first recirculation control logic 13. Shift register 15 has a 256 4-bit word storage capacity, and stores 256 of the binary values received from converter 11. First memory loop 18 comprises shift register 15, first logic 13 and an additional one word register 17 to provide for recirculation of a total of 257 data words. Loop 18 is driven by a 102.4 KHz clock located within first recirculation control logic 13, and operates so as to transfer from the loop 18 the oldest (earliest received) data word and to have shift register 15 receive a new digital data word every recirculation period of 2.5 milliseconds.

Individual data words or values that are transferred from the loop 18 each 2.5 milliseconds are applied simultaneously to a multiplier 19 of cross-correlator 20 and to an intermediate or third circulating memory loop 24. This third memory loop 24 is part of an updating means which additionally includes a fourth memory 31 and a first control signal means or copy signal conductor means 44, a second control signal means or trigger signal conductor 46, and a third control signal means or control signal conductor 48. Third memory loop 24, in turn, comprises a 256 word shift register 23 and a third recirculation control logic 21 and, as does loop 18, recirculates once each 2.5 milliseconds. This third memory loop 24 is described in greater detail following.

Correlator 20 comprises multiplier 19, an adder 33, two buffer registers 35 and 37 and a second converter means identified as digital to analog (D-A) converter 39. Multiplier 19 receives two input values, a first data value representing a sample of the periodic input sample received from loop 18 via first recirculation control logic 13, and a second data value representing a sample of a reference signal from a second memory loop identified as recirculation reference memory 30. This recirculation reference memory 30 comprises a shift register 29, an adder 27, and a second recirculation control logic 25. Recirculation reference memory 30 stores 256 data values of a reference signal with which the periodic signal is cross-correlated. This memory 30 is described in greater detail following.

Thus, multiplier 19 receives two input values, one being a data sample stored in one of the 256 locations of register 15, and the other being a reference value stored in one of the 256 locations of register 29. Multiplier 19 continuously produces products of the contents of corresponding locations of registers 15 and 29 at the clock frequency of 102.4 kHz according to the equation:

$$P(k) \quad D(k) \tag{1}$$

where, $(k)$ represents a corresponding address or location (0–255) of both registers 15 and 29, $P$ represents a product, $D$ represents reference data stored in register 29, and $S$ represents sampled data stored in register 15. This product $(P)$ formed by multiplier 19 is then summed by adder 33 and buffer register 35 to produce, during each recirculation period of 2.5 milliseconds, a cross-correlation value $C(t)$ that is the sum of 256 products. This correlation value $C(t)$, calculated as follows:

$$C(t) = \sum_{k=0}^{255} P(k) = \sum_{k=0}^{255} D(k) \cdot S(k) \tag{2}$$

is stored at the end of each 2.5 millisecond period into an output buffer register 37. Consecutive correlation values represent a cross-correlation waveform having peak values at those points of maximum amplitude where sampled and reference waveforms have generally the same shape. The cross-correlation value from buffer register 37 is then applied to D-A converter 39 where it is converted to analog form and applied to peak detector 40.

Figure 2:
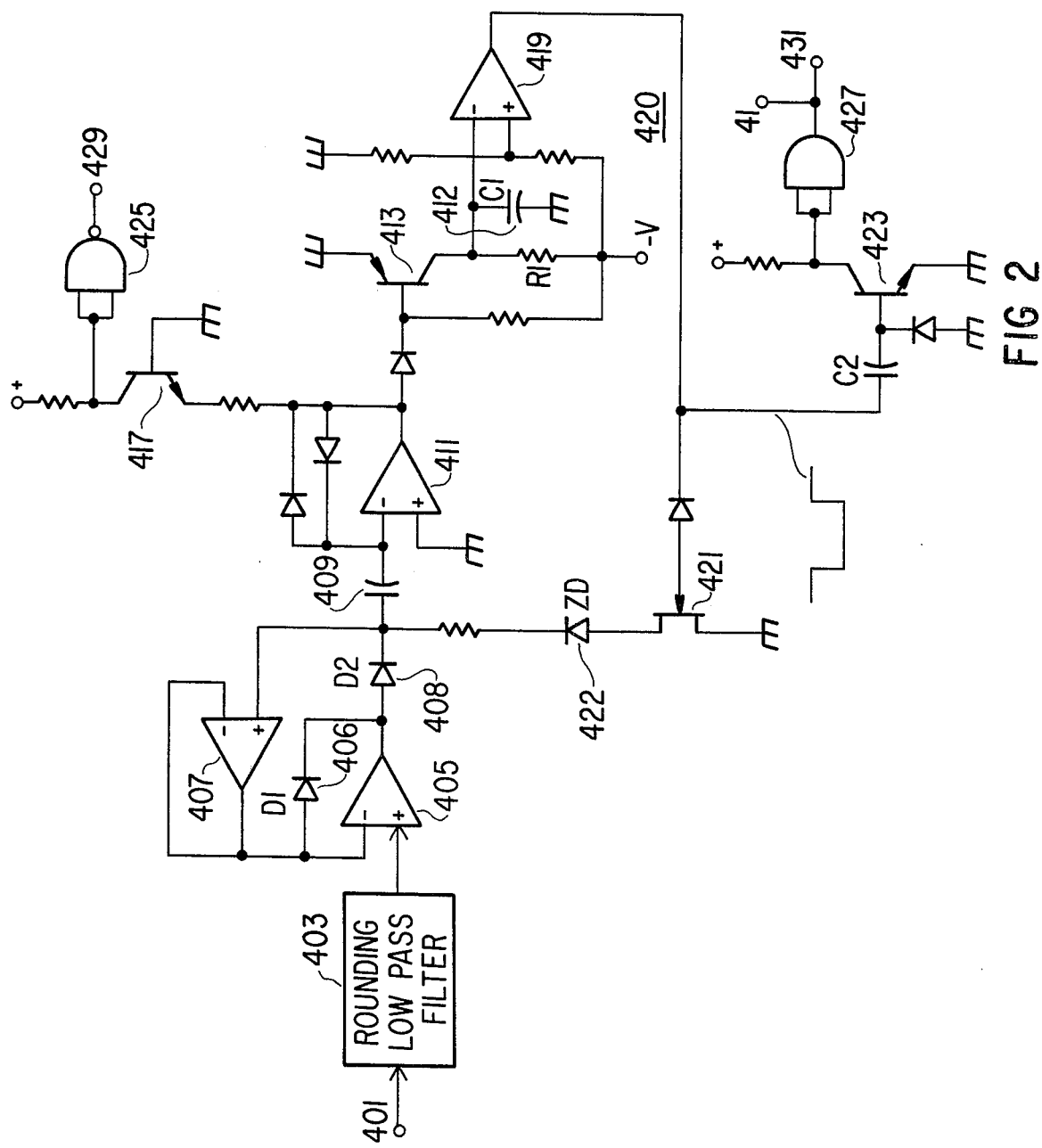
FIG. 2 is a circuit diagram of the peak detector shown in FIG. 1.

Peak detector 40 is shown in detail in FIG. 2. Cross-correlation signals from D-A converter 39 are applied, via input terminal 401, to low pass filter 403 of peak detector 40. This low pass filter 403, which has a cut-off frequency of approximately 100 Hz, rounds or smooths the signal from converter 39 and applies the smoothed signal to operational amplifier 405. Operational amplifier 405 operating in conjunction with operational amplifier 407, diodes 406 and 408 and a capacitor 409, detects and holds peak levels of the smoothed signal received from low pass filter 403. Capacitor 409, connected to diode 408 and operational amplifier 407, becomes charged as the slope of the smoothed signal becomes positive and, because of the effect of diodes 406 and 408, does not become discharged when the slope of the smoothed signal becomes negative. The voltage at capacitor 409 therefore reaches a peak, and is kept or held at this peak by the feedback operation of amplifier 407. The charge current of capacitor 409 is applied to amplifier 411 which produces an output signal that is applied to a transistor 413 and to a capacitor 412. This output signal causes transistor 413 to be "turned on" and the capacitor 412 to be discharged to zero voltage.

At the end of this charge-up sequence of capacitor 409, transistor 413 turns "off", causing a timer 420 to begin a timing sequence. Timer 420 includes an amplifier 419 and a capacitor 412. As transistor 413 turns "off", capacitor 412 becomes charged to a predetermined threshold voltage level, causing amplifier 419 to apply an output signal to a field-effect transistor (FET) 421. This, in turn, causes FET 421 to turn "on" and capacitor 409 to become discharged to a voltage level predetermined by a Zener diode 422.

The peak detector circuit 40 then waits for the occurrence of a next peak in the correlation signal received from converter 39. The end of the charge-up sequence occurs approximately 250 milliseconds after the occurrence of a peak in the correlation signal. Because this time delay of approximately 250 milliseconds is less than the shortest period of a fetal heart beat (the shortest period of a fetal being about 285 milliseconds), this permits peak detector 40 to detect and hold any subsequent peak of greater amplitude than the preceeding peak that may occur during the time delay period. In such an event, capacitor 409 would again become charged and capacitor 412 discharged, and a new delay period would be started after capacitor 409 reaches peak voltage. Thus, only the largest peak values are held by peak detector 40 as being significant.

The output signal from amplifier 419, in addition to being applied to FET 421, is applied to a transistor 423 and to a gate 427 for producing, via terminals 431 and 41, trigger pulses suitable to drive a rate meter. The trigger pulses that are applied to terminal 431 are 2.5 milliseconds in width and are used to update or refresh the reference values circulating in loop 30 (FIG. 1). These pulses are applied to second logic 25 via trigger signal conductor 46. The pulses that are supplied to terminal 41 are used by a processor 42, such as the 8020A cardiotocograph described on pages 9–11 of Hewlett-Packard Company's Manual 5M-10-68 entitled *Introduction to Fetal Monitoring*, to provide period and frequency information. By measuring the period or length of time between the trigger pulses applied to terminal 41, the processor 42 provides the period of the periodic input signal being measured, the recriprocal of this period being the frequency of the signal being measured.

Amplifier 411 is also connected, via a transistor 417, to a gate 425 for producing a copy command and for applying the command, via terminal 429 and via a copy signal conductor 44, to third recirculation control logic 21 (FIG. 1) of intermediate memory 24. The copy command signal has one logic state when holding capacitor 409 is being charged-up, and another logic state during the time that capacitor 409 is not being charged-up. When capacitor 409 is being charged-up, the copy signal causes intermediate memory 24 to be connected to circulating loop 18 in such a manner that the contents of register 15 of loop 18 are copied or stored into register 23 of intermediate memory 24. This copying operation terminates at the end of the charge-up sequence of capacitor 409, in which event intermediate memory 24 continues to circulate the copied data.

The reference data values stored in shift register 29 of loop 30 are refreshed or updated every 2.5 milliseconds. As shown in FIG. 1, updating is performed each time a trigger pulse is applied to second recirculation control logic 25 from peak detector 40 via terminal 431 and trigger signal conductor 46. As shown in FIG. 1, this conductor 46 may include an AND gate 45 to inhibit the refreshing operation as a user may desire. Recirculating reference values from shift register 29 are ordinarily applied twice to adder 27, first via input terminal 273 and again via second recirculation logic 25 and input terminal 271. Adder 27 calculates the arithmatic average of the two inputs by dividing the sum of the inputs by two and applying this average value to shift register 29. In this manner, the circulating reference values remain unchanged when the input values that are applied to terminals 273 and 271 are unchanged.

However, when a trigger signal is applied to second recirculation control logic 25 from peak detector 40, logic 25 disconnects terminal 272 and the reference values circulating from shift register 29, and connects terminal 274 permitting data values circulating in intermediate memory 24 to be applied to adder 27 via logic 25 and terminal 271. Adder 27 refreshes or updates the contents of shift register 29 and, hence, the reference data values circulating in loop 30 by averaging the data received at terminal 271 and the data received at terminal 273. This updating operation is performed for each data word according to the following:

$$S_{(n+1, k)} = \tfrac{1}{2} \{S_{(n, k)} + D_{(n, k)}\} \qquad (3)$$

where, $S_{(n+1,k)}$ represents a newly updated reference value, $S_{(n,k)}$ represents a prior reference value before updating, $D_{(n,k)}$ represents a data value from intermediate memory 24, $n$ represents the nth recirculation of loops 24 and 30, and $k$ represents a corresponding address of data word of both registers 23 and 29.

Figure 3A:
FIGS. 3 is an illustration of different seed pattern waveforms that may be utilized by the apparatus of FIG. 1.
Figure 3B:
Figure 3C:
Figure 3D:
Figure 3E:
Figure 3F:
Figure 3G:
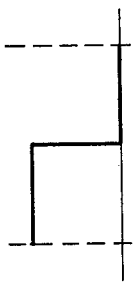
Figure 3H:

A seed pattern or starting set of 256 reference data values is used to initialize loop 30 when an input signal is first applied to the apparatus for measurement. This seed pattern is stored in a fourth memory identified as seed pattern memory 31, and is transferred from memory 31 to shift register 29 via second recirculation control logic 25 and adder 27. Any seed pattern may be used as initial reference values, but a seed pattern, to be suitable as initial reference values, should closely correspond in wave shape and phase to the input signal being measured. In measuring an input signal of the type shown in FIG. 3(a), for example, seed patterns corresponding to the waveforms shown in FIGS. 3(c) and 3(d) may be suitable, whereas seed patterns corresponding to the waveforms shown in FIGS. 3(b) and 3(e)–(h) would be unsuitable, the waveform of FIG. 3(h) being additionally unsuitable because its signal energy level is too low to produce a usable set of reference data values. In addition to its use in starting or initializing the apparatus, the seed pattern may be used to restart the apparatus. This restart operation may be performed automatically by second recirculation logic 25 upon the application of a control signal from peak detector 40 to logic 25 via control signal conductor 48, causing transfer of the seed pattern data from memory 31 to register 29 of loop 30 whenever an out-of-phase or phase drift condition is detected in the reference data values circulating in loop 30. Register 29 of loop 30 may also be restarted with seed pattern data from memory 31 whenever input signals being measured become too weak or too noisy. This condition may be signaled by the application of a control pulse to logic 25 via OR gate 43 of control signal conductor 48.

I claim:

1. An apparatus for measuring the period and frequency of a substantially periodic input signal waveform having random components by cross-correlating the input signal waveform with a reference waveform that is modified by the input signal waveform, said apparatus comprising:
   first memory means disposed to receive the input signal waveform to be measured and to store selected sections of said input signal waveform.
   second memory means coupled to said first memory means for storing a section of the reference waveform;
   cross-correlator means coupled to said first and second memory means for repeatedly cross-correlating sections of the stored input signal waveform with said section of the stored reference waveform to produce a cross-correlation waveform;
   peak-detector means coupled to said cross-correlator means for measuring the occurrence in time of relevant peaks of the cross-correlation waveform and producing an output signal indicative of such occurrences;
   processing means coupled to receive the output signal of said peak detector means for deriving the period and frequency of said input signal waveform from said output signal; and
   updating means coupled to said first and second memory means and to said peak detector means for periodically modifying the contents of the second memory means in accordance with sections of the input signal waveform stored in the first memory means.

2. An apparatus as in claim 1 wherein said updating means includes a third memory means for periodically storing sections of the signal waveform stored in the first memory means.

3. An apparatus as in claim 2 wherein said updating means also includes a first control signal means for storing in the third memory means the signal waveform sections stored in the first memory means.

4. An apparatus as in claim 3 wherein said first memory means includes a first recirculation control logic for controlling the recirculation, at a predetermined rate, of signal waveform values stored in said first memory means.

5. An apparatus as in claim 4 wherein said second memory means includes a second recirculation control logic for controlling the recirculaton at said predetermined rate of reference waveform values stored in said second memory means.

6. An apparatus as in claim 4 wherein said third memory means includes a third recirculation control logic for controlling the recirculation at said predetermined rate of signal waveform values stored in said third memory means.

7. An apparatus as in claim 6 wherein said updating means further includes a second control signal means for applying to said second memory means the waveform sections stored in said third memory means in order to modify the contents of said second memory means.

8. An apparatus as in claim 7 wherein said updating means also includes a fourth memory means for storing a seed pattern waveform section to be used as an initial reference waveform at the start of the signal measuring operation and as a restart reference waveform during the signal measuring operation.

9. An apparatus as in claim 8 wherein said updating means still further includes a third control signal means for applying said seed pattern waveform section to said second memory means to modify the contents of said second memory means.

10. An apparatus as in claim 1 wherein said second memory means includes an adder means for adding a predetermined fraction of the reference waveform to a predetermined fraction of the signal waveform.

11. An apparatus as in claim 1 wherein said apparatus further comprises a first converter means for receiving said signal waveform, for converting said signal waveform to digital form and for applying digital values representing preselected sections of each period of said signal waveform to said first memory means.

12. An apparatus as in claim 11 wherein said cross-correlator means includes a second converter means for converting cross-correlation values to analog data form and applying said converted data to said peak detector means.

* * * * *

UNITED STATES PATENT AND TRADEMARK OFFICE
CERTIFICATE OF CORRECTION

PATENT NO. : 4,037,151
DATED : July 19, 1977
INVENTOR(S) : Yasuhito Takauchi

It is certified that error appears in the above–identified patent and that said Letters Patent are hereby corrected as shown below:

Column 2, line 45, delete "P(k) D(k)" and insert -- $P(k)=D(k) \cdot S(k)$ --.

Signed and Sealed this

Twenty-second Day of November 1977

[SEAL]

Attest:

RUTH C. MASON
Attesting Officer

LUTRELLE F. PARKER
Acting Commissioner of Patents and Trademarks